(12) United States Patent
Krysak et al.

(10) Patent No.: US 12,107,044 B2
(45) Date of Patent: Oct. 1, 2024

(54) METAL OXYCARBIDE RESISTS AS LEAVE BEHIND PLUGS

(71) Applicant: Intel Corporation, Santa Clara, CA (US)

(72) Inventors: Marie Krysak, Portland, OR (US); Kevin L. Lin, Beaverton, OR (US); Robert Bristol, Portland, OR (US); Charles H. Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 989 days.

(21) Appl. No.: 16/389,672

(22) Filed: Apr. 19, 2019

(65) Prior Publication Data

US 2020/0335434 A1 Oct. 22, 2020

(51) Int. Cl.
*H01L 23/528* (2006.01)
*H01L 21/027* (2006.01)
*H01L 21/768* (2006.01)

(52) U.S. Cl.
CPC ........ *H01L 23/528* (2013.01); *H01L 21/0273* (2013.01); *H01L 21/76816* (2013.01); *H01L 21/76877* (2013.01)

(58) Field of Classification Search
CPC ............... H01L 23/528; H01L 21/0273; H01L 21/76816; H01L 21/76877
USPC ....................................................... 257/773
See application file for complete search history.

(56) References Cited

U.S. PATENT DOCUMENTS

| | | | | |
|---|---|---|---|---|
| 5,976,968 A | * | 11/1999 | Dai | G03F 1/30 430/311 |
| 6,645,851 B1 | * | 11/2003 | Ho | H01L 21/0273 438/626 |
| 2006/0011486 A1 | * | 1/2006 | Lockard | C25D 5/10 257/E21.585 |
| 2008/0014463 A1 | * | 1/2008 | Varadarajan | C09K 11/667 427/64 |
| 2013/0175637 A1 | * | 7/2013 | Chang | H01L 21/823475 257/E21.627 |

(Continued)

FOREIGN PATENT DOCUMENTS

| | | | |
|---|---|---|---|
| JP | 2006303063 | * | 11/2008 |
| KR | 100798275 | * | 1/2008 |
| KR | 20100078540 | * | 7/2010 |

*Primary Examiner* — Sheng-Bai Zhu
(74) *Attorney, Agent, or Firm* — Schwabe, Williamson & Wyatt P.C.

(57) ABSTRACT

Embodiments include a substrate and a method of forming the substrate. A substrate includes an interlayer dielectric and conductive traces in the interlayer dielectric (ILD). The conductive traces may include a first conductive trace surrounded by a second and third conductive traces. The substrate also includes a photoresist block in a region of the ILD. The region may be directly surrounded by the ILD and first conductive trace, and the photoresist block may be between the first conductive trace. The photoresist block may have a top surface that is substantially coplanar to top surfaces of the ILD and conductive traces. The photoresist block may have a width substantially equal to a width of the conductive traces. The photoresist block may be in the first conductive trace and between the second and third conductive traces. The photoresist block may include a metal oxide core embedded with organic ligands.

25 Claims, 9 Drawing Sheets

(56) References Cited

U.S. PATENT DOCUMENTS

| | | | |
|---|---|---|---|
| 2015/0014812 A1* | 1/2015 | Lan | H01L 23/642 |
| | | | 257/532 |
| 2015/0243598 A1* | 8/2015 | Zhong | H01L 21/76841 |
| | | | 257/773 |

\* cited by examiner

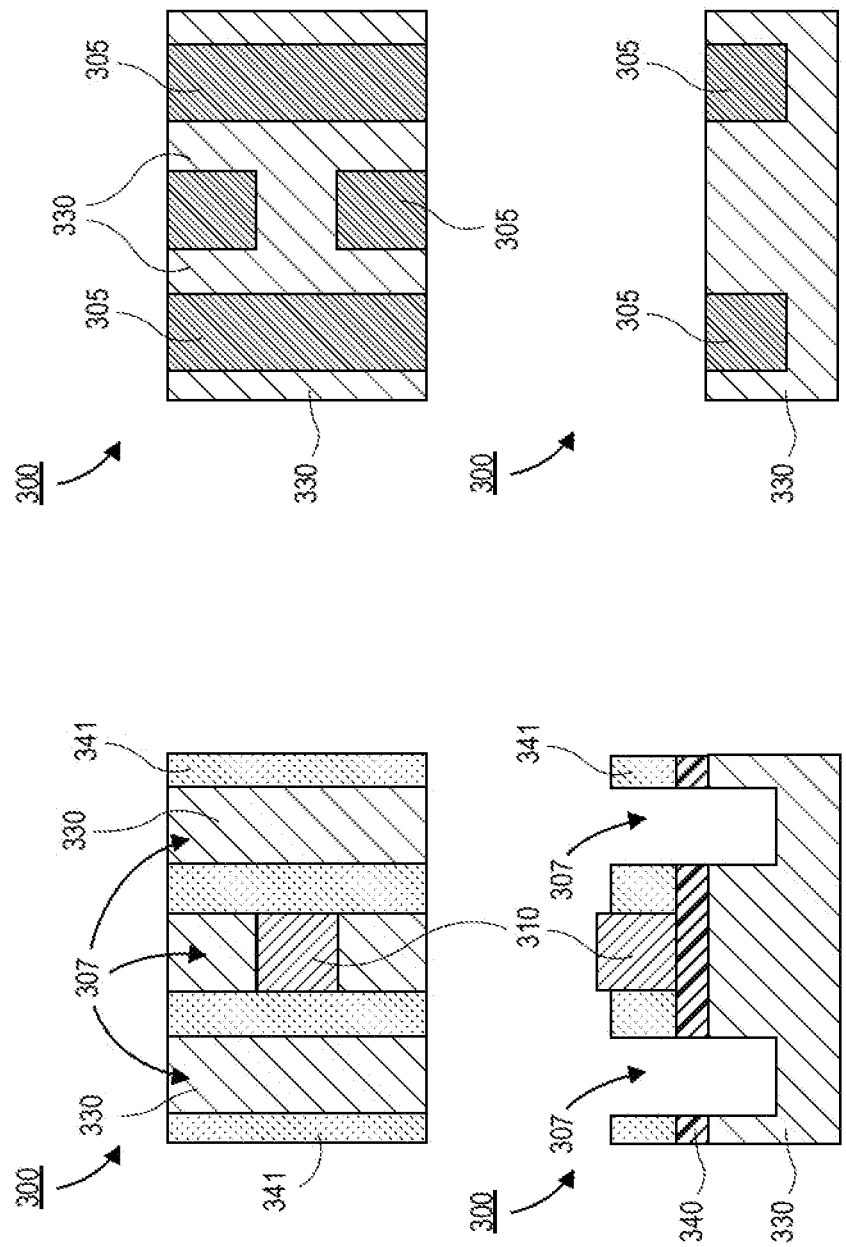

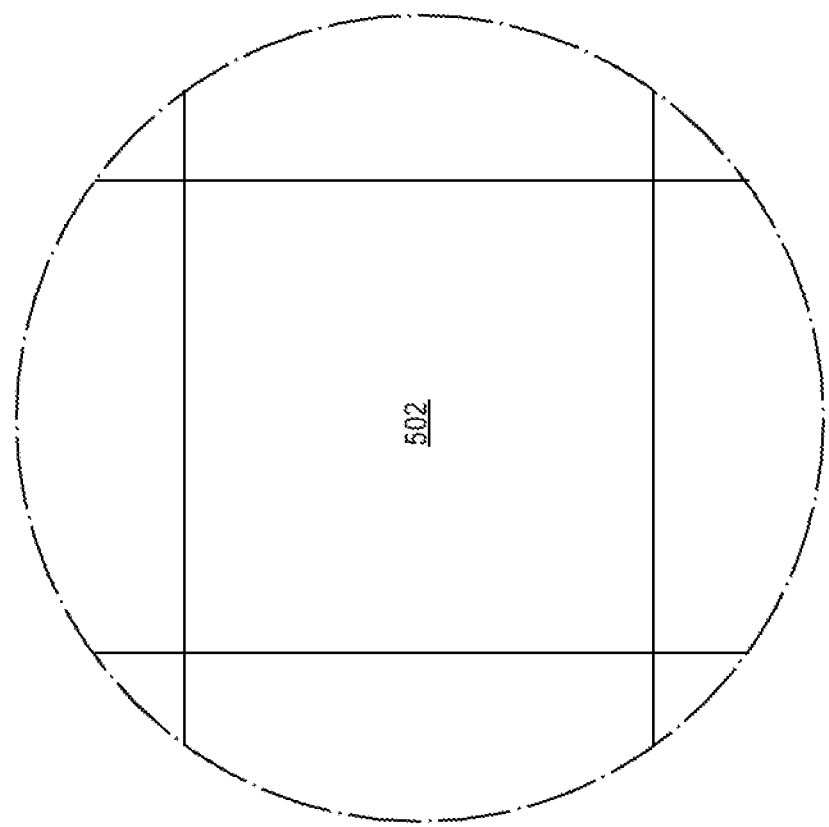
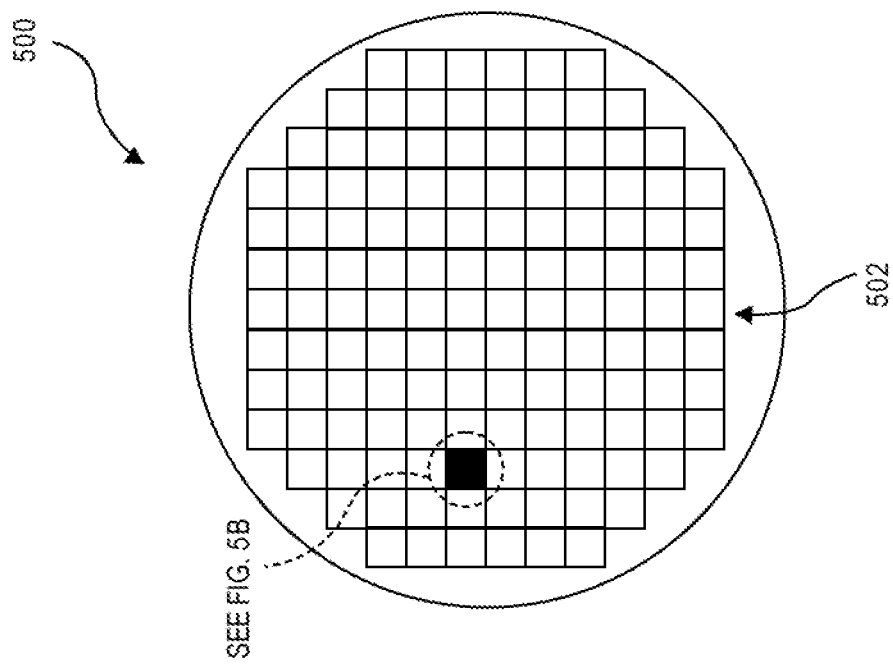
FIG. 5B
FIG. 5A

METAL OXYCARBIDE RESISTS AS LEAVE BEHIND PLUGS

FIELD

Embodiments relate to electronic structures and processing. More particularly, the embodiments relate to electronic structures with photoresist blocks that are patterned into and between metal interconnect layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The drive to scale integrated circuits, such as complementary metal-oxide-semiconductor (CMOS) devices, has recently been obtained through the use of stacked self-aligned transistors and/or stacked transistor architecture. These transistor architectures are typically implemented with lithography (litho) processes that pattern and form metallic interconnecting layers into interlayer dielectrics. Existing litho processes may use blocking layers, such as photoresist blocks, to form the metallic interconnecting layers. However, implementing photoresist blocks in tight-pitch layers to form these metallic layers requires intensive integration, such as necessitating grating reconstructions, positive tone patterning, and backfill steps. Some organic-based resists have been recently used as direct-patterning block to mitigate this integration, but these organic resists do not withstand the required high-temperatures, etches and cleans in the subsequent processing steps.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIGS. 3A-3D are cross-sectional views and their respective plan views of a process flow that forms a substrate having a plurality of conductive traces, a photoresist block, and an interlayer dielectric, where the photoresist block is initially patterned and disposed into the interlayer dielectric to form the plurality of conductive traces, according to some embodiments.

FIGS. 5A and 5B are illustrations of top views of an electronic device having a wafer and dies that include a plurality of photoresist blocks patterned and disposed into/between a plurality of conductive traces, according to some embodiments.

DETAILED DESCRIPTION

Figure 1:
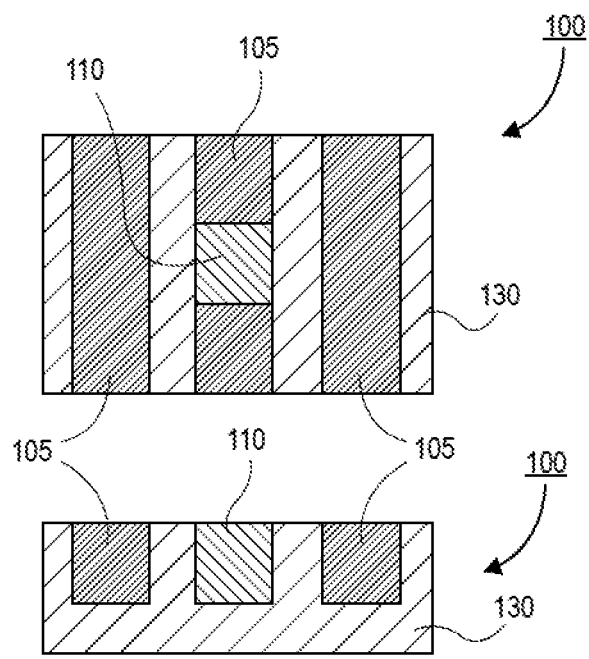
FIG. 1 is an illustration of a cross-sectional view and a respective plan view of a substrate having a plurality of conductive traces, a photoresist block, and an interlayer dielectric, where the photoresist block is patterned and disposed into/between the plurality of conductive traces, according to one embodiment.

Described herein are electronic structures with photoresist blocks that are patterned into and between metal interconnect layers and methods of forming such electronic packages. The electronic packages (e.g., semiconductor packages) described below and methods of forming such semiconductor packages include a substrate with a plurality of conductive traces, a photoresist block, and an interlayer dielectric (ILD), according to an embodiment. In these embodiments, the photoresist block may be patterned and disposed into a specific region of the ILD, where the photoresist block may then be cured and positioned in between the plurality of conductive traces, according to one embodiment.

As described herein, a "photoresist block" (also referred to as a blocking layer, a photoresist plug, or a plug) may refer to a photoresist material (or the like) that is lithographically patterned directly into a specific region(s) of an ILD, where the photoresist material may be subsequently cured to form a photoresist block (or a similar shaped pattern). In these embodiments described herein, the photoresist block may be patterned directly into the ILD, thereby occupying a tight-pitched three-dimensional (3D) space in the specific region of the ILD rather than disposing the photoresist material as a thin uniform layer over the ILD. Accordingly, the photoresist block may be cured into the ILD and disposed in a conductive trace (or a first conductive trace) and between other conductive traces (i.e., the photoresist block may be between two portions of the first conductive trace). Note that, as described herein, the photoresist block may be implemented as a dielectric material (or a similar material) that insulates the conductive traces (or the conductive wires) from one another, such as the photoresist block insulating one portion of the first conductive trace from another portion of the first conductive trace (e.g., as shown with the top view of FIG. 1).

In the embodiments described herein, the photoresist blocks and their respective locations in the ILD may be defined by extreme ultraviolet (EUV) lithography or the like (e.g., electron beam lithography, UV lithography, x-ray lithography, and/or a specifically-designed wavelength lithography). For example, during exposure, the photoresist cross-links and becomes insoluble in the developer solution. The unexposed photoresist may be subsequently removed, leaving behind the EUV defined photoresist blocks in the ILD. These photoresist blocks are then subject to an additional curing step to further crosslink/cure the metal oxycarbide (or the like), where the curing process may include a high-temperature bake, an ultraviolet (UV) (or EUV) cure, and/or any similar thermal bake.

In some embodiments, the photoresist block may be patterned into a square, a rectangle, a diamond, a polygon, an ellipse, a circle, or any similar desired shape. In an embodiment, the photoresist blocks described herein include a metal oxide core capped (or embedded/surrounded) with one or more organic ligands, where the metal oxide includes, but is not limited to, titanium oxide, zirconium oxide, hafnium oxide, aluminum oxide, tin oxide, and/or indium oxide. For example, the photoresist blocks patterned in the conductive trace and between the conductive traces may include a composition of at least metal, oxygen and carbon atoms (i.e., other atoms may also be included hydrogen, nitrogen, sulfur, and/or the like), where the composition of the photoresist blocks may include a carbon atomic composition that is approximately 20% or greater in atomic composition (e.g., approximately a 20% atomic carbon composition) than the existing atomic layer deposition (ALD) metal-oxide deposition processes.

Accordingly, embodiments described herein include improvements over existing processing technologies by providing a material/process that enables photoresist blocks with tight-pitches to be patterned directly into the ILD. These embodiments also facilitate processing technologies that are substantially less-expensive than existing manufacturing processes. Additionally, the embodiments described herein enable a processing flow that patterns photoresist blocks into tight-pitched regions rather than thin, planar layer formations, where the processing flow substantially reduces the number of processing steps typically required (i.e., such flow is not integration-intensive, and does not require grating reconstructions, positive tone patterning and/or backfill steps).

In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as integrated circuit design layouts such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

As used herein, the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Likewise, certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

As used herein, the terms metal interconnect(ing) layers, metal line, interconnect line, trace, wire, conductor, signal path, and signaling medium are all related and often used interchangeably. Furthermore, as used herein, a "metal layer" refers to a conductive layer that may include, but is not limited to, traces, wires, lines, interconnects, planes, and any other conductive formations. In some examples, the conductive/metal layer may be any suitable metal such as aluminum (Al), copper (Cu), and/or an alloy of Al and Cu, that are used as conductors to provide signal paths for coupling or interconnecting, electrical circuitry. In addition, the metal layer may include a metal trace (or a metal line/plane/pad) and a via that is coupled to the metal trace, where the via (or contact) may refer to a conductive interconnect/structure used to electrical couple/connect conductors, such as metal traces, from different metal/interconnect levels.

These complementary metal-oxide-semiconductor (CMOS) devices described herein may be implemented in one or more components associated with an integrated circuit (IC) and/or between various such components. As described herein, the terms chip, IC, monolithic device, semiconductor device, semiconductor package, and microelectronic device, are often used interchangeably in the semiconductor packaging field, and thus the embodiments described herein may be applicable to all of the above as known in this field. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in, for example, a computer.

Additionally, the embodiments described herein may be implemented further in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including an electronic device with a substrate that has a plurality of conductive traces, a plurality of photoresist blocks, and an interlayer dielectric, where the photoresist blocks are patterned and disposed into/between the plurality of conductive traces (e.g., as shown with the substrate 100 of FIG. 1).

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

Referring now to FIG. 1, a cross-sectional and respective top-view illustration of a substrate 100 is shown, in accordance with an embodiment. In one embodiment, the substrate 100 may include a plurality of conductive traces 105, a photoresist block 110, and an ILD 130, where the photoresist block 110 is patterned and disposed into/between the plurality of conductive traces 105.

As described herein, the substrate 100 may include a semiconductor substrate with one or more ILD layers over the semiconductor substrate. The substrate 100 may be any suitable type of substrate formed using one or more semiconductor materials, which may or may not be combined with silicon, that include but are not limited to germanium, indium antimonide, lead telluride, indium arsenide, indium phosphide, gallium arsenide, indium gallium arsenide, gallium antimonide, and/or other combinations of group III-V, group II-VI, or group IV materials. Although a few examples of materials from which the substrate 100 may be formed are described herein, any material that may serve as a foundation (or a foundation layer) upon which a CMOS device may be disposed on may be included (or considered) a substrate.

For other embodiments, the substrate 100 may be a base substrate, a carrier, and/or any well-known semiconductor, insulator, or metallic material. For example, the substrate 100 may be any suitable type of semiconductor substrate, such as a crystalline substrate (e.g., a monocrystalline silicon substrate/carrier), a bulk silicon substrate, a silicon-on-insulator (SOI) substrate, an engineered substrate formed of one or more semiconductor materials (e.g., crystalline silicon, amorphous silicon, polysilicon, etc.), and/or the like. In addition, for some embodiments, the substrate 100 may be full or ground down to a predetermined substrate thickness.

Note that, as described herein, a "substrate" may refer to a portion(s) of semiconducting material such as silicon, germanium, silicon carbide, diamond, gallium arsenide, and gallium nitride. For example, a substrate may be used to refer to a semiconductor chip. The semiconductor chip usually has two parallel surface planes, which are major crystallographic planes. ICs are built in and on the top surface of the semiconductor chip; recently, some IC elements have been disposed perpendicular to the top surface into the bulk of the semiconductor chip. Furthermore, as described herein, a top surface of the semiconductor chip may refer to the top parallel surface of the semiconductor chip—where the semiconductor material comes in contact with other material such as dielectric or conductive materials.

In these embodiments, the substrate 100 may be included with, but is not limited to, a package substrate, a substrate, a printed circuit board (PCB), and a motherboard. For one embodiment, the substrate may be a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers such as the ILDs 130, where the ILDs 130 may be any known dielectrics or insulating materials (e.g., silicon dioxide ($SiO_2$), silicon oxynitride (SiOxNy), a silicon nitride ($Si_3N_4$), or the like) that may be used to insulate the conductive traces 105. For one embodiment, the PCB may include a plurality of conductive interconnecting layers, which include the conductive traces 105 and conductive (or metallic/copper) lines, pads, vias, via pads, holes, and/or planes.

For some embodiments, the ILDs 130 (or ILD layers) may include one or more dielectric materials having a high-k dielectric, such as elements include hafnium, silicon, oxygen, titanium, tantalum, lanthanum, aluminum, zirconium, barium, strontium, yttrium, lead, scandium, niobium, and/or zinc. As used herein, a "high-k dielectric" refers to a material having a higher dielectric constant (k) than silicon oxide, where the terms "oxide," "carbide," "nitride," etc. refer to compounds containing, respectively, oxygen, carbon, nitrogen, etc. Examples of high-k materials that may be used in the ILDs 130 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and/or lead zinc niobate.

In other embodiments, the ILDs 130 may be formed using dielectric materials having low-k dielectric materials. Examples of such dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and/or organosilicates, such as silsesquioxane, siloxane, or organosilicate glass. For some embodiments, the ILDs 130 may include pores or air gaps to further reduce their dielectric constant.

As shown with the top-view of FIG. 1, the photoresist block 110 may be patterned and disposed into a specific region of the ILD 130, where the photoresist block 110 may then be cured and positioned in between the plurality of conductive traces 105, according to one embodiment. The photoresist block 110 may include a photoresist material (or any similar resist material) that is lithographically patterned directly into the specific region of the ILD 130, and subsequently exposed to form the photoresist block 110. The photoresist block 110 may be disposed directly into a tight-pitched 3D space (i.e., a specific region with a well-defined XYZ volume) of the ILD 130, where such photoresist block 110 is disposed both into the conductive trace 105 and between the conductive traces 105.

In some embodiments, the photoresist block 110 may be patterned into a square, a rectangle, a diamond, a polygon, an ellipse, a circle, or any similar desired shape. In one embodiment, the photoresist block 110 may have a plurality of sidewalls (e.g., four sidewalls when the photoresist block is a square/rectangle), where the sidewalls may be patterned as a plurality of substantially vertical sidewalls and/or a plurality of tapered sidewalls. In an embodiment, the photoresist block 110 may include a metal oxide core that is embedded with one or more organic ligands, where the metal oxide core may include, but is not limited to, titanium oxide, zirconium oxide, hafnium oxide, aluminum oxide, tin oxide, and/or indium oxide. For example, the photoresist block 110 may include a composition of at least metal, oxygen and carbon atoms, where the composition of the photoresist block 110 may include a carbon atomic composition that is approximately 20% or greater in atomic composition (e.g., approximately 20% atomic composition) than the existing ALD metal-oxide deposition processes.

In these embodiments, the photoresist block 110 and their respective locations in the ILD 130 may be implemented/defined by a EUV lithography or the like. For example, the photoresist block 110 may be patterned and disposed directly into the ILD 130 and between the conductive traces 105 with lithographic processes, using EUV light sources, electron beams, UV light sources, x-rays, and/or any specifically-designed wavelengths. In some embodiments, the photoresist may be patterned directly into a specific region of a trench of the ILD 130 and may be rendered insoluble. Accordingly, the unexposed photoresist in the trench of the ILD 130 may be subsequently removed to form the photoresist block 110 in the tight-pitched region. In some embodiments, an additional curing step may be implemented on the substrate 100 to further develop (or crosslink/cure) the metal oxycarbide (or the like) of the photoresist block 110, where the curing process/step may include a high-temperature bake, an UV (or EUV) cure, and/or any similar thermal bake.

Accordingly, the photoresist block 110 allows the substrate 100 to have one or more packaging/processing advantages. These advantages include (i) implementing a photoresist material that is not substantially organic-based as such the photoresist material of the photoresist block 110 may withstand any high-temperature curing, etching, and cleaning (or removing) in subsequent processing steps, and (ii) mitigating additional etch processes as the photoresist is patterned directly into the trench and acts as a good dielectric, thereby the substrate does not require etching to create the photoresist block (i.e., the photoresist block is formed directly during the lithography/cure process).

Figure 2B:
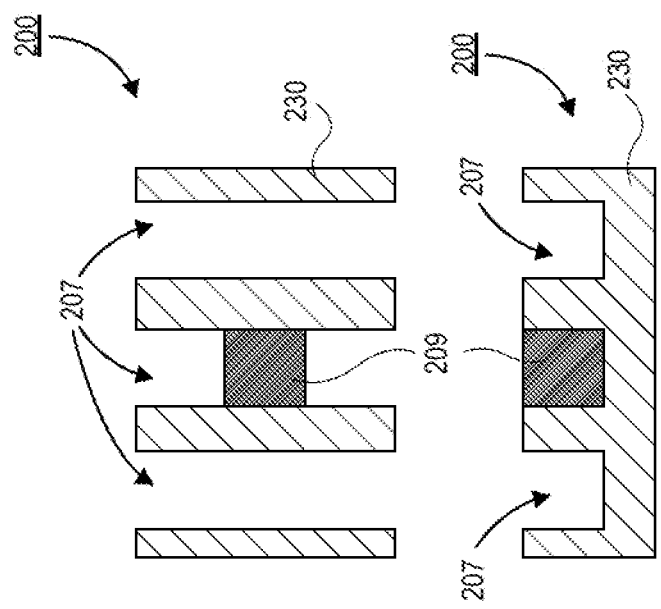
FIGS. 2A-2D are cross-sectional views and their respective plan views of a process flow that forms a substrate having a plurality of conductive traces, a photoresist block, and an interlayer dielectric, where the photoresist block is patterned and disposed into/between the plurality of conductive traces, according to some embodiments.
Figure 2A:
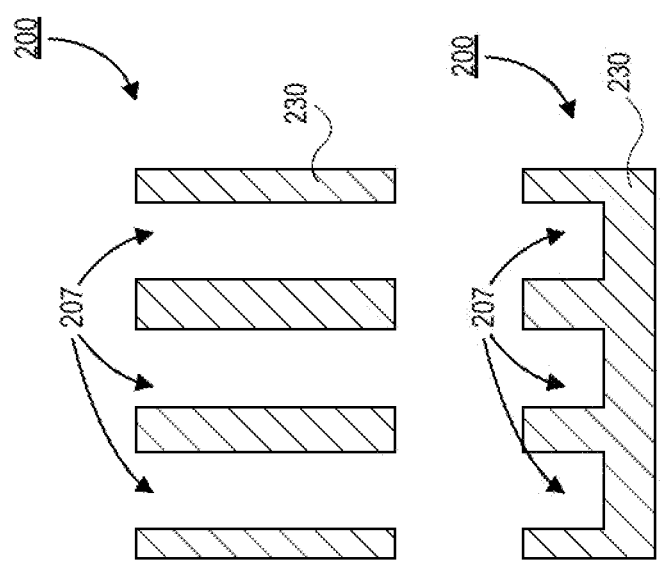
Figure 2C:
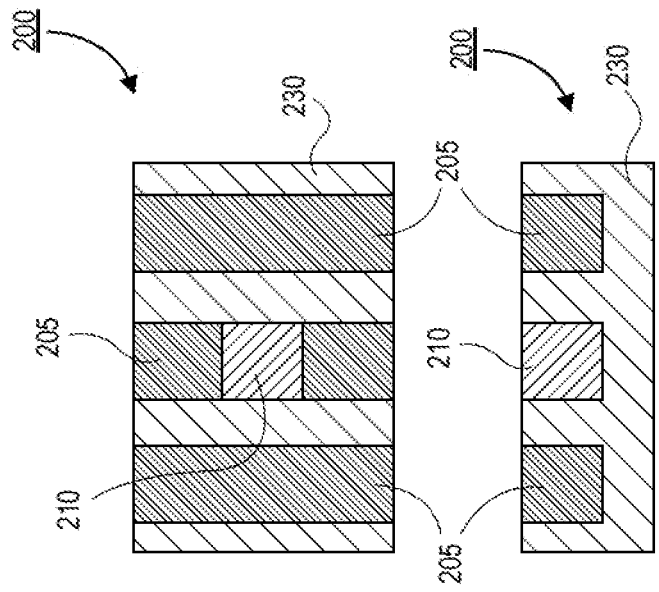
Figure 2D:
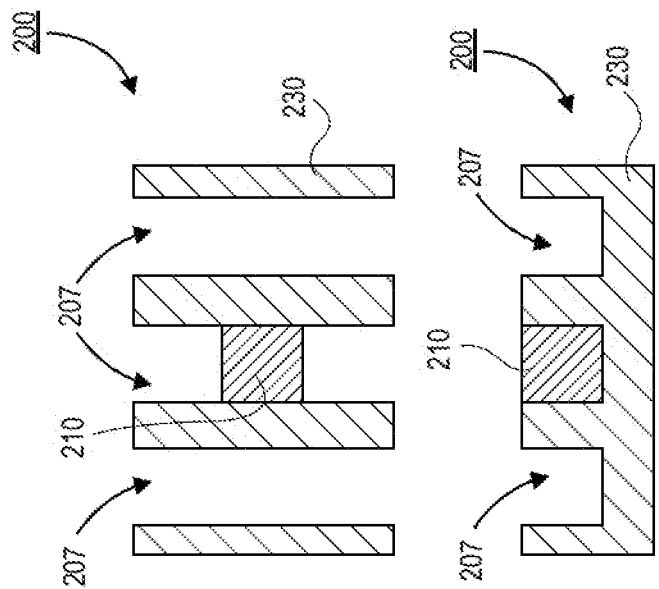

Furthermore, after the formation of the photoresist block 110 into one of the trenches of the ILD 130, the conductive traces 105 may be disposed (or deposited) in the remaining exposed trenches of the ILD 130 (e.g., as shown in FIGS. 2C-2D). Accordingly, in an embodiment, the substrate 100 may have the photoresist block 110 disposed in the specified region of the interlayer dielectric, where the specified region is directly surrounded by the ILD 130 and one of the conductive traces 105 (i.e., as shown in FIG. 1, a first conductive trace surrounded by second and third conductive traces), and where the photoresist block 110 is thus disposed (or formed/patterned) into the ILD 130 and between two conductive portions of the one conductive trace 105 (or the first conductive trace).

For one embodiment, the conductive traces 105 may be formed of a conductive material (or a metallic material), such as copper, gold, cobalt, tungsten or the like, where the conductive traces 105 may be formed using a lithographic process or the like. In one embodiment, the conductive traces 105 may then be planarized (or substantially flattened) using a chemical-mechanical process (CMP) or the like, where the conductive traces 105 may have a top surface that is substantially coplanar to both a top surface of the photoresist block 110 and a top surface of the ILD 130. For some embodiments, the conductive traces 105 may have a thickness that is equal to a thickness of the photoresist block 110, where both thicknesses may be approximately between 20-60 nm. Note that, in other embodiments, the thicknesses may be less than 20 nm.

The conductive traces 105 may be implemented as a plurality of conductive interconnects that are disposed into the ILDs 130 of the substrate 100. As used herein, the "conductive interconnects" may refer to one or more semiconductor (or CMOS) interconnects, including, but are not limited to, semiconductor wires, nanowires (NWs), nanoribbons (NRs), CMOS devices (e.g., negative-channel MOS (NMOS) and positive-channel MOS (PMOS) devices/channels), and/or the like. In addition, as described herein, the "conductive interconnects" may be formed to have multiple, different shapes (e.g., square, elongated, oval, rectangular, circular, etc.) based on the desired processing/packing application or design.

Note that the substrate 100 may include fewer or additional packaging components based on the desired packaging design.

FIGS. 2A-2D are a series of cross-sectional and respective top-view illustrations that depict a substrate 200 with a plurality of conductive traces 205, a photoresist block 210, and an ILD 230, according to some embodiments. The process flow illustrated in FIGS. 2A-2D form the substrate 200 that is substantially similar to the substrates 100 described above in FIG. 1. Accordingly, as described above, this process flow of the substrate 200 illustrates one of the approaches to directly pattern and dispose the photoresist block 210 into the ILD 230 and between the conductive traces 205, according to some embodiments.

Referring now to FIG. 2A, a cross-sectional and respective top-view illustration of a substrate 200 is shown, in accordance with an embodiment. In an embodiment, the substrate 200 may include a plurality of trenches 207 patterned in the ILD 230. The ILD 230 may be substantially similar to the ILD 130 described above in FIG. 1. In an embodiment, the trenches 207 may have a thickness and a width that may be used to pattern and dispose the photoresist blocks and the conductive traces described below in subsequent steps.

Referring now to FIG. 2B, a cross-sectional and respective top-view illustration of a substrate 200 is shown, in accordance with an embodiment. In an embodiment, a photoresist material 209 may be directly patterned into a specific region of the trenches 207 in the ILD 230. The photoresist material 209 may be substantially similar to the photoresist material of the photoresist block 110 described above in FIG. 1, except that the photoresist material 209 is uncured. In one embodiment, the photoresist material 209 may have a top surface that is substantially coplanar to a top surface of the ILD 230. As shown in the top-view of FIG. 2B, the photoresist material 209 may be patterned (or disposed) into one of the trenches 207 of the ILD 230 to have a desired volume with a specified width, length, and thickness (or z-height). Accordingly, the desired volume of the photoresist material 209 may be used to form a photoresist block after a curing (or heating) process as described below in a subsequent step Referring now to FIG. 2C, a cross-sectional and respective top-view illustration of a substrate 200 is shown, in accordance with an embodiment. In an embodiment, the photoresist material may be cured in the trench 207 of the ILD 230 to form a photoresist block 210 using EUV lithography or the like. The photoresist block 210 may be substantially similar to the photoresist block 110 described above in FIG. 1. In some embodiments, the photoresist block 210 may have a square/rectangular shape or any other similar desired shape. Additionally, as described above, the photoresist block 210 may be cured using a high-temperature back, a UV (or EUV) cure, and/or any similar thermal heating/baking process.

Referring now to FIG. 2D, a cross-sectional and respective top-view illustration of a substrate 200 is shown, in accordance with an embodiment. In an embodiment, after the formation of the photoresist block 210, a plurality of conductive traces 205 may be disposed (or deposited) in the other exposed trenches 207 of the ILD 230 to surround (or embed) the photoresist block 210, thereby the photoresist block 210 may be respectively disposed between the conductive traces 205. The conductive traces 205 may be substantially similar to the conductive traces 105 described above in FIG. 1.

The conductive traces 205 may be formed of a conductive material (or a metallic material), such as copper, gold, cobalt, tungsten or the like, where the conductive traces 205 may be formed using a lithographic process or the like. In one embodiment, the conductive traces 205 may then be planarized (or substantially flattened) using a CMP process or the like, where the conductive traces 205 may have a top surface that is substantially coplanar to both a top surface of the photoresist block 210 and a top surface of the ILD 230. For some embodiments, the conductive traces 205 may have a thickness that is equal to a thickness of the photoresist block 210, where both thicknesses may be approximately between 20-60 nm. Note that, in other embodiments, the thicknesses may be less than 20 nm.

Note that the substrate 200 of FIGS. 2A-2D may include fewer or additional packaging components based on the desired packaging design.

FIGS. 3A-3D are a series of cross-sectional and respective top-view illustrations that depict a substrate 300 with a plurality of conductive traces 305 and an ILD 330, according to some embodiments. The process flow illustrated in FIGS. 3A-3D form the substrate 300 that is similar to the substrates 100 and 200 described above in FIGS. 1-2, except that a photoresist block (as described above) is used to directly pattern the conductive traces 305 into the ILD 330, but the photoresist block is removed after an etching process. Accordingly, as described above, this process flow of the substrate 300 illustrates one of the approaches that enables using pre-patterned hard masks for ultrafast lithographic imaging, thereby the photoresist material 309 may be spun in a grating pattern using a plurality of hardmask layers 340-341 (or the pre-patterned hardmasks) to directly pattern and dispose the photoresist material/block 309-310 into a specific region(s) in the ILD 330, which then helps pattern the conductive traces 305, according to some embodiments.

Figure 3B:
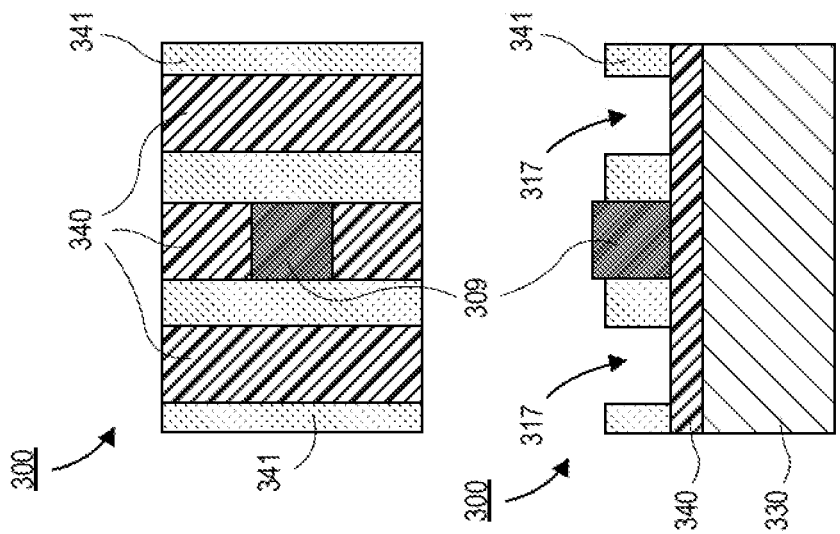
Figure 3A:
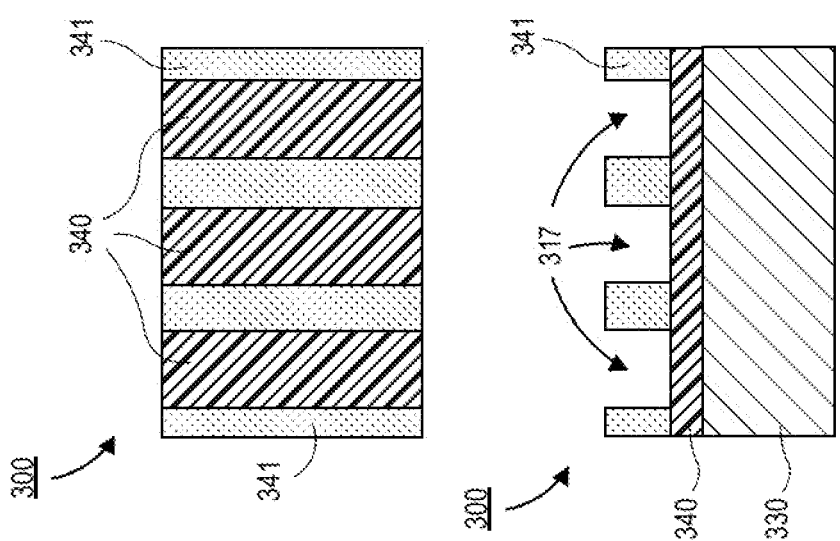

Referring now to FIG. 3A, a cross-sectional and respective top-view illustration of a substrate 300 is shown, in accordance with an embodiment. In an embodiment, the substrate 300 may include a first hardmask layer 340 and a second hardmask layer 341 over the ILD 330. The ILD 330 may be substantially similar to the ILD 130 described above in FIG. 1. In an embodiment, the first and second hardmask layers 340-341 may be used to pattern the ILD 330 for the formation of the conductive traces as described below in the subsequent steps. The first and second hardmask layers 340-341 may be formed of silicon oxide, tin, titanium, and/or any similar material(s) known in the art. The second hardmask layer 341 may include a plurality of openings 317 that expose the top surface of the first hardmask layer 340. These openings 317 may be disposed over the ILD 330 to pattern the ILD 330 for the formation of the trenches as described below in the subsequent steps.

Referring now to FIG. 3B, a cross-sectional and respective top-view illustration of a substrate 300 is shown, in accordance with an embodiment. In an embodiment, a photoresist material 309 may be directly patterned into a specific region in the second hardmask layer 341 and over the first hardmask layer 340 and the ILD 330. The photoresist material 309 may be substantially similar to the photoresist material of the photoresist block 110 described above in FIG. 1, except that the photoresist material 309 is uncured. For one embodiment, the photoresist material 309 may cover the specific region over the top surface of the first hardmask layer 340, while the other regions (or patterns) of the first hardmask layer 340 remain exposed.

In one embodiment, the photoresist material 309 may have a top surface that is above (or over) a top surface of the second hardmask layer 341. As shown in the top-view of FIG. 3B, the photoresist material 309 may be patterned (or disposed) into one of the openings 317 of the second hardmask layer 341 to have a desired volume with a specified width, length, and thickness (or z-height). Accordingly, the desired volume of the photoresist material 309 may be used to form a photoresist block after a curing (or heating) process as described below in a subsequent step.

Referring now to FIG. 3C, a cross-sectional and respective top-view illustration of a substrate 300 is shown, in accordance with an embodiment. In an embodiment, the photoresist material may be cured in the opening of the second hardmask layer 341 to form a photoresist block 310 using EUV lithography or the like. The photoresist block 310 may be substantially similar to the photoresist block 110 described above in FIG. 1. In some embodiments, the photoresist block 310 may have a square/rectangular shape or any other similar desired shape. Additionally, as described above, the photoresist block 310 may be cured using a high-temperature back, a UV (or EUV) cure, and/or any similar thermal heating/baking process. In one embodiment, a plurality of trenches 307 may be patterned through the unexposed surfaces of the first hardmask layer 340 and into the ILD 330. The trenches 307 may be formed with an etching process or the like. In an embodiment, the trenches 307 may have a thickness and a width that may be used to pattern and dispose the conductive traces described below in subsequent steps.

Referring now to FIG. 3D, a cross-sectional and respective top-view illustration of a substrate 300 is shown, in accordance with an embodiment. For one embodiment, a plurality of conductive traces 305 may be disposed (or deposited) in the trenches 307 of the ILD 330 and surrounded (or embedded) in the ILD 330. In an embodiment, the photoresist block 310, the first hardmask layer 340, and the second hardmask layer 341 are removed to expose the top surface of the ILD 330, thereby leaving a region (or a trench region) of the ILD 330 that is not disposed with the conductive material of the conductive traces 305 (e.g., as shown with the top-view of FIG. 3D). The conductive traces 305 may be substantially similar to the conductive traces 105 described above in FIG. 1.

The conductive traces 305 may be formed of a conductive material (or a metallic material), such as copper, gold, or the like, where the conductive traces 305 may be formed using a lithographic process or the like. In one embodiment, the conductive traces 305 may then be planarized (or substantially flattened) using a CMP process or the like, where the conductive traces 305 may have a top surface that is substantially coplanar to both a top surface of the ILD 330. For some embodiments, the conductive traces 305 may have a thickness approximately between 20-60 nm. Note that, in other embodiments, the thickness may be less than 20 nm.

Additionally, in some embodiments, the top surface of the ILD 330 may have a remaining portion (or a plurality of scattered thin portions/layers) of the photoresist materials used to form the photoresist block 310 (as shown above in FIG. 3C) in the patterned region between the conductive traces 305, where the remaining portion may include a composition of at least metal, oxygen and carbon atoms (e.g., where the remaining portions/compositions of the photoresist material may include a carbon atomic composition that is approximately 20% or greater in atomic composition (e.g., approximately 20% atomic composition) than the existing ALD metal-oxide deposition processes).

Figure 4:
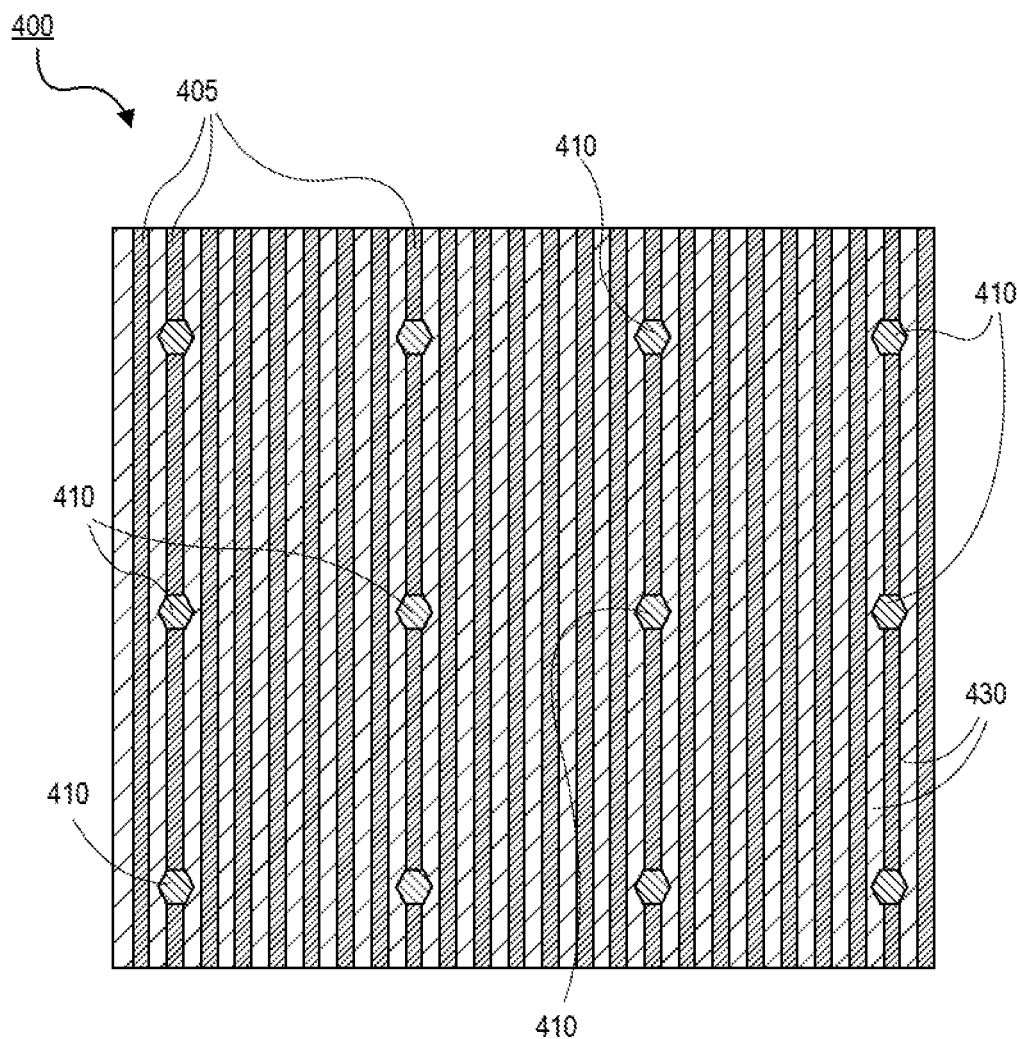
FIG. 4 is a plan view of a substrate having a plurality of conductive traces, a plurality of photoresist blocks, and a plurality of interlayer dielectrics, where the plurality of photoresist blocks are patterned and disposed into/between the plurality of conductive traces and the plurality of interlayer dielectrics, according to some embodiments.

Note that the substrate 300 of FIGS. 3A-3D may include fewer or additional packaging components based on the desired packaging design Referring now to FIG. 4, a top-view illustration of a substrate 400 is shown, in accordance with an embodiment. In an embodiment, the substrate 400 includes a plurality of photoresist blocks 410 directly patterned and disposed into the ILD 430 and in between a plurality of conductive traces 405. The substrate 400 is substantially similar to the substrates 100 and 200 described above in FIGS. 1 and 2A-2D. Accordingly, the photoresist blocks 410, the conductive traces 405, and the ILD 430 are substantially similar to the photoresist block 110, the conductive trace 105, and the ILD 130 described above in FIG. 1.

In some embodiments, the photoresist blocks 410 may be directly patterned and disposed into the specific regions of the ILD 430 and the conductive traces 405 (as illustrated in the top-view of FIG. 4) using a EUV lithography or the like. In an embodiment, the photoresist block 410 may be formed as a square, a rectangle, a diamond, a polygon, an ellipse, a circle, or any similar desired shape. Additionally, as described above, the photoresist block 410 may be cured using a high-temperature back, a UV (or EUV) cure, and/or any similar thermal heating/baking process. In one embodiment, the conductive traces 405 may have planarized surfaces that are formed using a CMP process or the like, where the conductive traces 405 may have a top surface that is substantially coplanar to both the top surfaces of the photoresist blocks 410 and the top surface of the ILD 430.

Note that the substrate 400 may include fewer or additional packaging components based on the desired packaging design.

Referring now to FIGS. 5A-5B. The integrated circuit structures described herein may be included in an electronic device. As an example of one such apparatus, FIGS. 5A and 5B are top views of a wafer and dies that include one or more transistor devices with a plurality of stacked transistors that utilize a single workfunction gate metal, in accordance with one or more of the embodiments described herein.

As illustrated in FIGS. 5A-5B, a wafer 500 may be composed of semiconductor material and may include one or more dies 502 having IC structures formed on a surface of the wafer 500. Each of the dies 502 may be a repeating unit of a semiconductor product that includes any suitable IC (e.g., ICs with one or more transistor devices having a plurality of stacked transistors that utilize a single workfunction gate metal as described above). After the fabrication of the semiconductor product is complete, the wafer 500 may undergo a singulation process in which each of the dies 502 is separated from one another to provide discrete "chips" of the semiconductor product. In particular, structures that include embedded non-volatile memory structures having an independently scaled selector as described herein may take the form of the wafer 500 (e.g., not singulated) or the form of the die 502 (e.g., singulated). The die 502 may include one or more embedded non-volatile memory structures based independently scaled selectors and/or supporting circuitry to route electrical signals, as well as any other IC components. In some embodiments, the wafer 500 or the die 502 may include an additional memory device (e.g., SRAM device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Embodiments described herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches described herein.

Note that the wafer 500 and/or the die 502 of FIGS. 5A-5B may include fewer or additional components and/or materials based on the desired packaging design.

Figure 6:
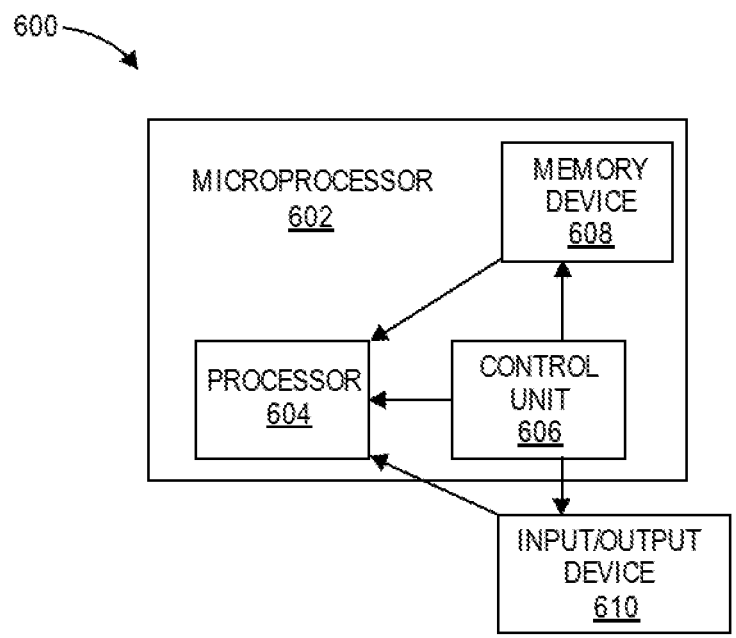
FIG. 6 is a schematic block diagram illustrating an electronic system that utilizes an input/output (I/O) device and a semiconductor package, which includes a processor, a memory device, and a control unit, according to one embodiment.

FIG. 6 is a schematic block diagram illustrating an electronic system 600 that utilizes an I/O device 610 and a microprocessor 602, which includes a processor 604, a memory device 608, and a control unit 606, according to one embodiment. FIG. 6 is an illustration of an electronic system 600, according to one embodiment. The electronic system 600 can correspond to, for example, a portable system, a computer system, a process control system, or any other system that utilizes a processor and an associated memory. The electronic system 600 may include the microprocessor 602, the processor 604, the control unit 606, the memory device 608, and the I/O device 610. Note that it is to be appreciated that the electronic system 600 may have a plurality of processors, control units, memory device units, and/or I/O devices in various embodiments. In one embodiment, the electronic system 600 has a set of instructions that define operations which are to be performed on data by the processor 604, as well as, other transactions between the processor 604, the memory device 608, and the I/O device 610. The control unit 606 coordinates the operations of the processor 604, the memory device 608 and the I/O device 610 by cycling through a set of operations that cause instructions to be retrieved from the memory device 608 and executed. The memory device 608 can include a substrate as described above (e.g., the substrates 100, 200, 300, and 400 of FIGS. 1-4). In an embodiment, the memory device 608 is embedded in the microprocessor 602, as illustrated in FIG. 6. In another embodiment, the processor 604, or another component of the electronic system 600 may include a substrate with a plurality of conductive traces, a photoresist block, and an ILD, where the photoresist block may be directly patterned and disposed into a specific region of the ILD and positioned in between the conductive traces, such as those described herein.

Note that the electronic system 600 of FIG. 6 may include fewer or additional packaging components and/or materials based on the desired packaging design.

Figure 7:
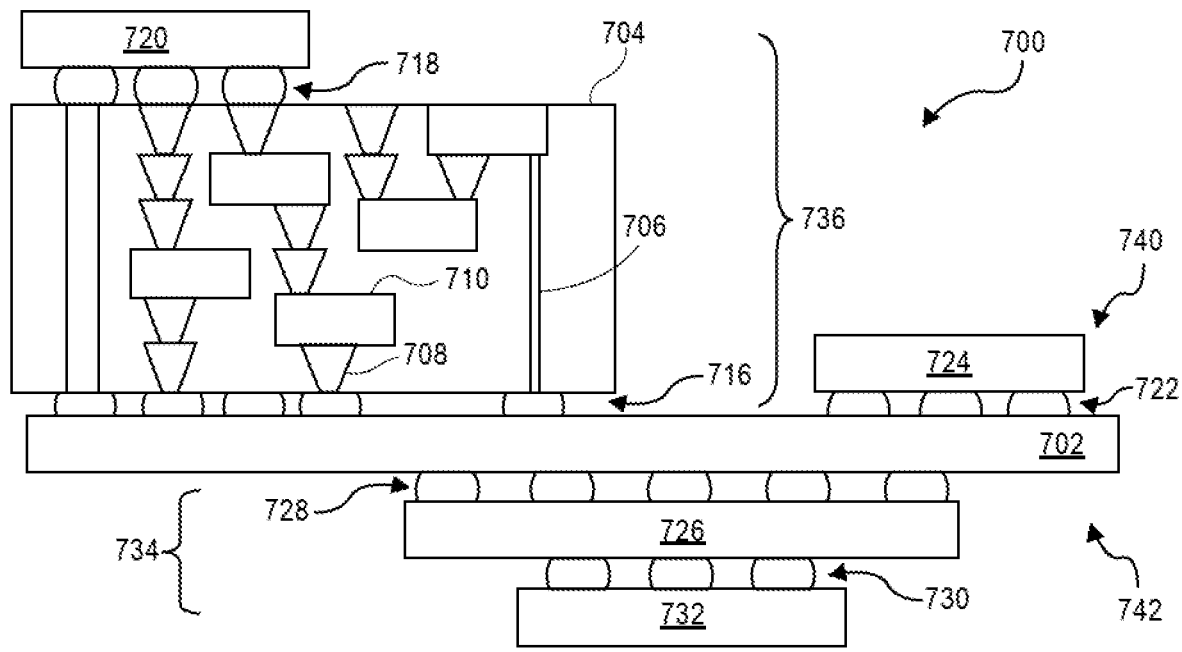
FIG. 7 is a cross-sectional view of an integrated circuit (IC) device assembly that includes a plurality of photoresist blocks patterned and disposed into/between a plurality of conductive traces, according to one embodiment.

FIG. 7 is a cross-sectional side view of an IC device assembly which may include one or more transistor devices with a plurality of stacked transistors that utilize a single workfunction gate metal, in accordance with one or more of the embodiments described herein. As illustrated in FIG. 7, an IC device assembly 700 includes components having one or more IC structures as described herein. The IC device assembly 700 includes a number of components disposed on a circuit board 702 (e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include a number of CMOS structures, such as the substrates having conductive traces, photoresist blocks, and one or more ILDs, where the photoresist blocks may be directly patterned and disposed into specific regions of the ILDs and positioned in between the conductive traces, as described herein.

In some embodiments, the circuit board 702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. Note that it is to be appreciated that additional interposers may be coupled to the interposer 704. The interposer 704 may provide an intervening substrate used to bridge the circuit board 702 and the IC package 720. The IC package 720 may be or include, for example, a die (e.g., the die 502 of FIG. 5B), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiments illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 710 and vias 708, including but not limited to through-silicon vias (TSVs) 706. The interposer 704 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments described above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 described above. The package-on-package structure 734 may be configured in accordance with any of the package-on-package structures known in the art.

Note that the IC device assembly 700 of FIG. 7 may include fewer or additional packaging components and/or materials based on the desired packaging design.

Figure 8:
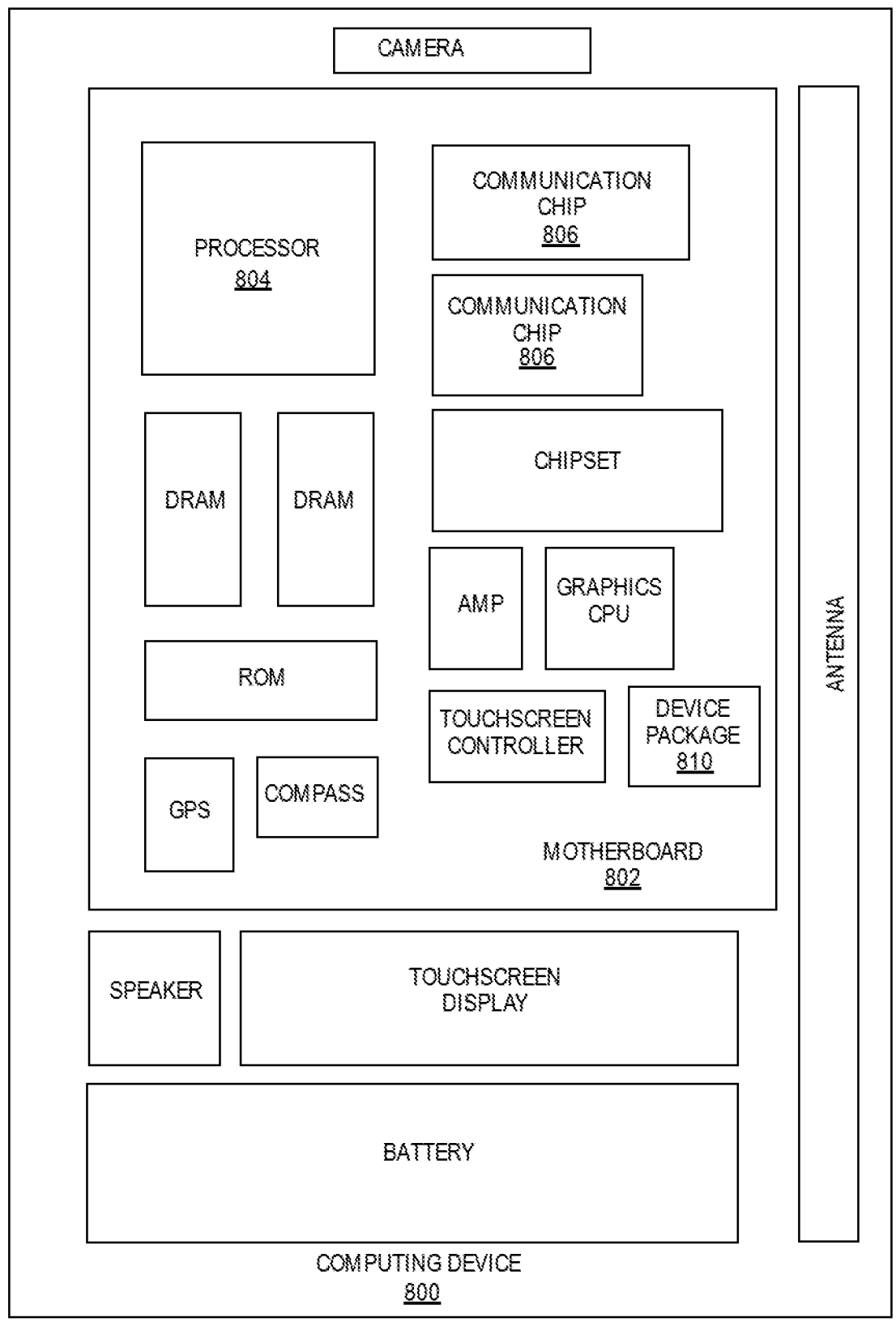
FIG. 8 is a schematic block diagram illustrating a computer system that utilizes a device package having a substrate with a plurality of conductive traces, a photoresist block, and an interlayer dielectric, where the photoresist block is patterned and disposed into/between the plurality of conductive traces, according to one embodiment.

FIG. 8 is a schematic block diagram illustrating a computer system 800 that utilizes a device package 810 having a substrate with a plurality of conductive traces, a photoresist block, and an ILD, where the photoresist block may be directly patterned and disposed into a specific region of the ILD and positioned in between the conductive traces, according to one embodiment. FIG. 8 illustrates an example of computing device 800. Computing device 800 houses motherboard 802. For one embodiment, motherboard 802 may be similar to the circuit board 702 of FIG. 7. Motherboard 802 may include a number of components, including but not limited to processor 804, device package 810, and at least one communication chip 806. Processor 804 is physically and electrically coupled to motherboard 802. For some embodiments, at least one communication chip 806 is also physically and electrically coupled to motherboard 802. For other embodiments, at least one communication chip 806 is part of processor 804.

Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 806 enables wireless communications for the transfer of data to and from computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

Processor 804 of computing device 800 includes an integrated circuit die packaged within processor 804. Device package 810 may be, but is not limited to, a substrate, a package substrate, a CMOS package, a microelectronic device, and/or a PCB. Device package 810 may include a substrate having conductive traces, photoresist blocks, and one or more ILDs, where the photoresist blocks may be directly patterned and disposed into specific regions of the ILDs and positioned in between the conductive traces, as described herein (e.g., as illustrated in FIGS. 1-4). Device package 810 may also include any other components from the Figures described herein.

Note that device package 810 may be a single component/device, a subset of components, and/or an entire system, as the materials, features, and components may be limited to device package 810 and/or any other component of the computing device 800 that may need to directly pattern and dispose photoresist blocks into specific regions of the ILDs and between the conductive traces (e.g., the motherboard 802, the processor 804, and/or any other component of the computing device 800).

For certain embodiments, the integrated circuit die may be packaged with one or more devices on a substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 806 also includes an integrated circuit die packaged within the communication chip 806. For some embodiments, the integrated circuit die of the communication chip may be packaged with one or more devices on a substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a substrate, comprising: an interlayer dielectric; a plurality of conductive traces in the interlayer dielectric, wherein the plurality of conductive traces include a first conductive trace surrounded by a second conductive trace and a third conductive trace; and a photoresist block in a region of the interlayer dielectric, wherein the region is directly surrounded by the interlayer dielectric and the first conductive trace, and wherein the photoresist block is between two portions of the first conductive trace.

In example 2, the subject matter of example 1 can optionally include that the photoresist block has a top surface that is substantially coplanar to a top surface of the interlayer dielectric and top surfaces of the plurality of conductive traces.

In example 3, the subject matter of examples 1-2 can optionally include that the photoresist block has a width that is substantially equal to a width of the plurality of conductive traces.

In example 4, the subject matter of examples 1-3 can optionally include that the photoresist block is in the first conductive trace, and wherein the photoresist block is between the second and third conductive traces.

In example 5, the subject matter of examples 1-4 can optionally include that the photoresist block includes one or more shapes, and wherein the one or more shapes a square, a rectangle, a diamond, a polygon, an ellipse, or a circle.

In example 6, the subject matter of examples 1-5 can optionally include that the photoresist block includes a metal oxide core that is embedded with one or more organic ligands, and wherein the metal oxide core includes titanium oxide, zirconium oxide, hafnium oxide, aluminum oxide, tin oxide, or indium oxide.

In example 7, the subject matter of examples 1-6 can optionally include that the photoresist block has one or more sidewalls.

In example 8, the subject matter of example 7 can optionally include that the one or more sidewalls of the photoresist block may be a tapered sidewall or a substantially vertical sidewall, and wherein the one or more sidewalls are directly coupled to the interlayer dielectric and the first conductive trace.

In example 9, the subject matter of examples 1-8 can optionally include that the photoresist block has a thickness that is substantially equal to a thickness of the plurality of conductive traces.

Example 10 is a method of forming a substrate, comprising: patterning a plurality of trenches in an interlayer dielectric; disposing a photoresist material into a region of the plurality of trenches to form a photoresist block directly in the interlayer dielectric; and disposing a conductive material into the plurality of trenches to form a plurality of conductive traces in the interlayer dielectric, wherein the plurality of conductive traces include a first conductive trace surrounded by a second conductive trace and a third conductive trace, wherein the photoresist block is directly surrounded by the interlayer dielectric and the first conductive trace, and wherein the photoresist block is between two portions of the first conductive trace.

In example 11, the subject matter of example 10 can optionally include that the photoresist block has a top surface that is substantially coplanar to a top surface of the interlayer dielectric and top surfaces of the plurality of conductive traces.

In example 12, the subject matter of examples 10-11 can optionally include that the photoresist block has a width that is substantially equal to a width of the plurality of conductive traces.

In example 13, the subject matter of examples 10-12 can optionally include that the photoresist block is in the first conductive trace, and wherein the photoresist block is between the second and third conductive traces.

In example 14, the subject matter of examples 10-13 can optionally include that the photoresist block includes one or more shapes, and wherein the one or more shapes include a square, a rectangle, a diamond, polygon, an ellipse or a circle.

In example 15, the subject matter of examples 10-14 can optionally include that the photoresist block includes a metal oxide core that is embedded with one or more organic ligands, and wherein the metal oxide core includes titanium oxide, zirconium oxide, hafnium oxide, aluminum oxide, tin oxide, or indium oxide.

In example 16, the subject matter of examples 10-15 can optionally include that the photoresist block has one or more sidewalls, wherein the one or more sidewalls of the photoresist block may be a tapered sidewall or a substantially vertical sidewall, and wherein the one or more sidewalls are directly coupled to the interlayer dielectric and the first conductive trace.

In example 17, the subject matter of examples 10-16 can optionally include that the photoresist block has a thickness that is substantially equal to a thickness of the plurality of conductive traces.

In example 18, the subject matter of examples 10-17 can optionally include that the photoresist block is formed with an extreme ultraviolet lithography, an electron beam lithography, an ultraviolet lithography, or an x-ray lithography.

Example 19 is a memory device, comprising: a semiconductor substrate; and a transistor device above the semiconductor substrate, wherein the semiconductor substrate includes an interlayer dielectric; a plurality of conductive traces in the interlayer dielectric; and a plurality of photoresist blocks in a plurality of regions of the interlayer dielectric, wherein the plurality of regions are directly surrounded by the interlayer dielectric and a plurality of first conductive traces of the plurality of conductive traces, and wherein each of the plurality of photoresist blocks is between two portions of each of the plurality of first conductive traces.

In example 20, the subject matter of example 19 can optionally include that the plurality of photoresist blocks have a top surface that is substantially coplanar to a top surface of the interlayer dielectric and top surfaces of the plurality of conductive traces.

In example 21, the subject matter of examples 19-20 can optionally include that the plurality of photoresist blocks have a width that is substantially equal to a width of the plurality of conductive traces.

In example 22, the subject matter of examples 19-21 can optionally include that the plurality of photoresist blocks are in the plurality of first conductive traces, and wherein the plurality of photoresist blocks are between the other plurality of conductive traces.

In example 23, the subject matter of examples 19-22 can optionally include that the plurality of photoresist blocks include one or more shapes, and wherein the one or more shapes include a square, a rectangle, a diamond, a polygon, an ellipse, or a circle.

In example 24, the subject matter of examples 19-23 can optionally include that the plurality of photoresist blocks include a metal oxide core that is embedded with one or more organic ligands, and wherein the metal oxide core includes titanium oxide, zirconium oxide, hafnium oxide, aluminum oxide, tin oxide, or indium oxide.

In example 25, the subject matter of examples 19-24 can optionally include that the plurality of photoresist blocks have one or more sidewalls, wherein the one or more sidewalls of the photoresist block may be a tapered sidewall or a substantially vertical sidewall, wherein the one or more sidewalls are directly coupled to the interlayer dielectric and the first conductive trace, and wherein the plurality of photoresist blocks have a thickness that is substantially equal to a thickness of the plurality of conductive traces.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. A substrate, comprising:
    an interlayer dielectric;
    a plurality of conductive traces along a first direction in the interlayer dielectric, wherein the plurality of conductive traces include a first conductive trace laterally spaced apart from a second conductive trace and laterally spaced apart from a third conductive trace along a second direction orthogonal to the first direction, the first conductive trace between the second conductive trace and the third conductive trace; and
    a photoresist block in a region of the interlayer dielectric, the photoresist block discrete from the interlayer dielectric, wherein the photoresist block is laterally between and in contact with two portions of the first conductive trace along the first direction, and wherein the photoresist block is in contact with the interlayer dielectric along the second direction.

2. The substrate of claim 1, wherein the photoresist block has a top surface that is substantially coplanar to a top surface of the interlayer dielectric and top surfaces of the plurality of conductive traces.

3. The substrate of claim 1, wherein the photoresist block has a width that is substantially equal to a width of the plurality of conductive traces.

4. The substrate of claim 1, wherein the photoresist block is in the first conductive trace, and wherein the photoresist block is between the second and third conductive traces.

5. The substrate of claim 1, wherein the photoresist block includes one or more shapes, and wherein the one or more shapes a square, a rectangle, a diamond, a polygon, an ellipse, or a circle.

6. The substrate of claim 1, wherein the photoresist block includes a metal oxide core that is embedded with one or more organic ligands, and wherein the metal oxide core includes titanium oxide, zirconium oxide, hafnium oxide, aluminum oxide, tin oxide, or indium oxide.

7. The substrate of claim 1, wherein the photoresist block has one or more sidewalls.

8. The substrate of claim 7, wherein the one or more sidewalls of the photoresist block is a tapered sidewall or a substantially vertical sidewall, and wherein the one or more sidewalls are directly coupled to the interlayer dielectric and the first conductive trace.

9. The substrate of claim 1, wherein the photoresist block has a thickness that is substantially equal to a thickness of the plurality of conductive traces.

10. A method of forming a substrate, comprising:
    patterning a plurality of trenches along a first direction in an interlayer dielectric;
    disposing a photoresist material into a region of the plurality of trenches to form a photoresist block directly in the interlayer dielectric, the photoresist block discrete from the interlayer dielectric; and
    disposing a conductive material into the plurality of trenches to form a plurality of conductive traces along the first direction in the interlayer dielectric, wherein the plurality of conductive traces include a first conductive trace laterally spaced apart from a second conductive trace and laterally spaced apart from a third conductive trace along a second direction orthogonal to the first direction, the first conductive trace between the second conductive trace and the third conductive trace, wherein the photoresist block is laterally between and in contact with two portions of the first conductive trace along the first direction, and wherein the photoresist block is in contact with the interlayer dielectric along the second direction.

11. The method of claim 10, wherein the photoresist block has a top surface that is substantially coplanar to a top surface of the interlayer dielectric and top surfaces of the plurality of conductive traces.

12. The method of claim 10, wherein the photoresist block has a width that is substantially equal to a width of the plurality of conductive traces.

13. The method of claim 10, wherein the photoresist block is in the first conductive trace, and wherein the photoresist block is between the second and third conductive traces.

14. The method of claim 10, wherein the photoresist block includes one or more shapes, and wherein the one or more shapes include a square, a rectangle, a diamond, polygon, an ellipse or a circle.

15. The method of claim 10, wherein the photoresist block includes a metal oxide core that is embedded with one or more organic ligands, and wherein the metal oxide core includes titanium oxide, zirconium oxide, hafnium oxide, aluminum oxide, tin oxide, or indium oxide.

16. The method of claim 10, wherein the photoresist block has one or more sidewalls, wherein the one or more sidewalls of the photoresist block is a tapered sidewall or a substantially vertical sidewall, and wherein the one or more sidewalls are directly coupled to the interlayer dielectric and the first conductive trace.

17. The method of claim 10, wherein the photoresist block has a thickness that is substantially equal to a thickness of the plurality of conductive traces.

18. The method of claim 10, wherein the photoresist block is formed with an extreme ultraviolet lithography, an electron beam lithography, an ultraviolet lithography, or an x-ray lithography.

19. A memory device, comprising:
a semiconductor substrate; and
an integrated circuit structure above the semiconductor substrate, wherein the integrated circuit structure includes:
    an interlayer dielectric;
    a plurality of conductive traces along a first direction in the interlayer dielectric, the plurality of conductive traces laterally spaced apart from one another in the interlayer dielectric along a second direction orthogonal to the first direction; and
    a plurality of photoresist blocks in a plurality of regions of the interlayer dielectric, the plurality of photoresist blocks discrete from the interlayer dielectric, wherein each of the plurality of photoresist blocks is laterally between and in contact with two portions of a corresponding one of the plurality of conductive traces along the first direction, and wherein each of the photoresist blocks is in contact with the interlayer dielectric along the second direction.

20. The memory device of claim 19, wherein the plurality of photoresist blocks have a top surface that is substantially coplanar to a top surface of the interlayer dielectric and top surfaces of the plurality of conductive traces.

21. The memory device of claim 19, wherein the plurality of photoresist blocks have a width that is substantially equal to a width of the plurality of conductive traces.

22. The memory device of claim 19, wherein the plurality of photoresist blocks are in the plurality of first conductive traces, and wherein the plurality of photoresist blocks are between the other plurality of conductive traces.

23. The memory device of claim 19, wherein the plurality of photoresist blocks include one or more shapes, and wherein the one or more shapes include a square, a rectangle, a diamond, a polygon, an ellipse, or a circle.

24. The memory device of claim 19, wherein the plurality of photoresist blocks include a metal oxide core that is embedded with one or more organic ligands, and wherein the metal oxide core includes titanium oxide, zirconium oxide, hafnium oxide, aluminum oxide, tin oxide, or indium oxide.

25. The memory device of claim 19, wherein the plurality of photoresist blocks have one or more sidewalls, wherein the one or more sidewalls of the photoresist block is a tapered sidewall or a substantially vertical sidewall, wherein the one or more sidewalls are directly coupled to the interlayer dielectric and the first conductive trace, and wherein the plurality of photoresist blocks have a thickness that is substantially equal to a thickness of the plurality of conductive traces.

* * * * *